(12) United States Patent
Lin

(10) Patent No.: US 6,179,636 B1
(45) Date of Patent: Jan. 30, 2001

(54) HOLDER OF AN ELECTRIC CONNECTOR

(75) Inventor: Rong Huei Lin, Taipei Hsien (TW)

(73) Assignee: Starlink Electronics Corp., Taipei Hsien (TW)

(*) Notice: Under 35 U.S.C. 154(b), the term of this patent shall be extended for 0 days.

(21) Appl. No.: 09/275,441

(22) Filed: Mar. 24, 1999

(51) Int. Cl.[7] ................................................. H01R 13/62
(52) U.S. Cl. ............................................................ 439/160
(58) Field of Search ..................................... 439/160, 157

(56) References Cited

U.S. PATENT DOCUMENTS

| | | | | |
|---|---|---|---|---|
| 5,364,282 | * | 11/1994 | Tondreault | 439/157 |
| 5,387,115 | * | 2/1995 | Kozel et al. | 439/157 |
| 5,577,922 | * | 11/1996 | Enomoto et al. | 439/157 |
| 5,634,803 | * | 6/1997 | Cheng et al. | 439/157 |
| 5,779,489 | * | 7/1998 | Davis et al. | 439/79 |

* cited by examiner

*Primary Examiner*—Brian Sircus
*Assistant Examiner*—Phuong KT Dinh
(74) *Attorney, Agent, or Firm*—Dougherty & Troxell

(57) ABSTRACT

An improvement of the holder of an electric connector comprises a terminal seat, a plurality of terminals, embedding seats and embedding pieces. The terminal seat is made by insulating materials. A pair of symmetric embedding seats having a U shape are installed on the two ends of the terminal seat for receiving respective embedding pieces. A guide groove, a pivotal hole, fixing inclined surfaces is formed on the inner wall surface of the embedding seat, so that the embedding pieces is inserted into the embedding seat with a fixing angle, and the rotary angle of the embedding piece is confined. The lateral wall surface of the terminal seat is flat. Holding holes with a size thinner than that of the terminal hole are extended from the two sides of the terminal hole for firmly securing the terminal within the terminal seat.

2 Claims, 13 Drawing Sheets

HOLDER OF AN ELECTRIC CONNECTOR

BACKGROUND OF THE INVENTION

1. Field of the Invention

The present invention relates to an electric connector, and especially to a holding means of an electric connector, wherein a guide groove, a pivotal hole and a fixing inclined surface are installed on the inner lateral wall surface of the embedding seat for fixing an embedding piece so that the embedding piece can be inserted into the embedding seat from a predetermined orientation, and the embedding piece is only rotated within the predetermined angle, and the smoothness of the outer lateral wall surface of the terminal seat is retained and the connecting terminals can be firmly secured to the terminal seat.

2. Background of the Invention

In the field of electrically connectors, an electric connector for electric connecting a circuit board and the mother board of a computer is included. The approximate structure is shown in FIGS. 1A and 1C. This kind of electric connector includes a terminal seat 100, a plurality of terminal holes 120a on the bottom of the terminal seat 100 along the longitudinal direction of the terminal seat. Each of the terminal holes serves to receive a terminal 120b. Two ends of the terminal seat are installed with respective embedding seats 130. The bottom of the embedding seat is installed with a fixing device (not shown, referring to relative figures) for fixing an electric connector to a mother board; When the terminal seat 100 contacts with the mother board (not shown ) by the fixing means on the bottom thereof, the terminal 120b of the terminal hole 120a on the bottom of the terminal seat 100 will contact with the circuit trace of the mother board and an electrical connection is achieved.

In a prior art electric connector, because of the differences of molds and shaping, an apparent trench 110a and a pivotal hole 110b through the wall surface will be formed on the outer wall surface 110 of the terminal seat. Although the trench 110a and the pivotal hole 110b serves to easily separate the electric connector and the mold, the completeness of the outer wall surface 110 of the insulating housing is potentially reduced. Moreover, on the inner wall surface of the embedding seat 130 is not installed with inclined surfaces for confining the rotation of the embedding piece so that the embedding piece 200 is probable to rotate to a large angle. As a result, the embedding piece 200 and the embedding seat are destroyed.

FIG. 1C is a terminal holder of a prior art electric connector. The terminal hole 120a is a long hole with a fixed width, and the width of the hole is greatly larger than the thickness of the terminal body. Therefore, as a user arranges a terminal seat 100 in a mother board (not shown), the terminal with a very thin thickness is probable shifted and vibrated since the terminal seat 100 is moved by the user and the terminal hole 120a can not firmly secure the terminal, further, the terminal can not effectively contact the mother board. Besides, in that electric connector, in order to effectively improve the function of the terminal hole to fixing the terminal, a clamping piece 140 must be installed on the edge of the terminal hole. Accordingly, further fabrication process and mold are necessary.

Another object of the present invention is to provide an electric connector, wherein an inclined angle is formed between the pair of inner inclined surfaces of the embedding seat so that the embedding piece only rotates within a predetermined angle, so as to prevent the embedding piece to be broken due to a large rotary angle.

A further object of the present invention is to provide an electric connector, wherein the pivotal hole is installed within the embedding seat but does not penetrate through the wall surface of the electric connector so that the completeness of the outer lateral surface of the terminal seat is retained, and the probability of destroying the housing is reduced.

A further object of the present invention is to provide an electric connector, wherein the guide groove on the embedding seat is formed with a predetermined angle with the buckling piece, so that the embedding piece is embedded into the embedding seat from a fixing orientation.

A further object of the present invention is to provide an electric connector, wherein, two ends of the terminal hole on the bottom of the terminal seat are extended for clamping the holding hole so that the terminal can be held securely.

The other object of the present invention is to provide an electric connector, wherein an inverse hook is formed on the outer edge of a terminal. When a terminal is inserted into a terminal hole, the terminal will tightly engage with the wall of the holding hole so that the terminal is firmly secured within the terminal seat.

Accordingly, since the prior art electric connectors have many defects, there is an eager demand for a novel designed electric connector which can improve the aforementioned disadvantages.

SUMMARY OF THE INVENTION

Accordingly, the object of the present invention is to provide an electric connector comprising a terminal seat, a plurality of terminals, two embedding seats, and two embedding pieces. The terminal seat is made of insulating material, two sides of the terminal seat are installed with U shape embedding seats, the inner lateral wall surfaces of the embedding seats are installed with guide grooves for being embedded by the embedding pieces, respectively. The two embedding seats are symmetrical with one another. The inner lateral wall surface of the embedding seat is installed with a pivotal hole which does not penetrate through the wall surface of the embedding seat so that the completeness of the lateral wall of the embedding seat is retained. The wall surface of the pivotal hole is inclined so that the embedding piece is successfully embedded into the hole. A plurality of inclined surfaces are formed on the inner wall of the embedding seat, which are conformed with the reduced inclined surface of the embedding piece for confining the rotary angle of the embedding piece. A fixing device is installed in a place near the edge of the bottom of the embedding seat with a proper distance so as to fix the terminal seat in a mother board. The embedding piece has an approximate rectangular shape and is pivotally connected to the embedding seat; each side of the two sides of each embedding piece is installed with a pillar; the lateral surface of each pillar is formed with an inclined angle so that it can be easily embedded into a pivotal hole. Besides, the pillar also serves as the rotary axis of the embedding piece. A buckling piece is formed on the embedding piece near the upper portion of the pillar and with respect to the pivotal hole of the embedding seat. The buckling piece and the guide groove on the inner lateral surface of the embedding seat are formed with a fixed angle to guide the embedding piece to embed into the embedding seat. A plurality of reduced inclined surfaces are formed on the inner lateral wall surface of the embedding piece, conforming with the inclined surfaces on the inner lateral wall surface of the embedding seat, the rotary angle of the embedding piece is confined so to prevent that the embedding piece and the wall surface of the embedding seat are destroyed due to a large rotary angle. A pulling portion is installed on the top portion of the embedding piece so that the embedding piece is easily pulled to rotate.

The shape and structure of bottom of the terminal seat according to the present invention has the function of fixing a terminal, so that during installing the electric connector, the terminal will not be destroyed and the electric connection between the terminal and the mother board will not be affected. Besides, further fabrication process of the housing of the terminal seat are unnecessary, while the same effect as the prior art clamping piece of the terminal housing is achieved. The edges of two sides of terminal are installed with inverse hook, after the terminal is embedded into the terminal hole, the terminal is effectively combined with the inner wall the holding hole.

The present invention will be better understood and its numerous objects and advantages will become apparent to those skilled in the art by referencing to the following drawings in which:

DETAILED DESCRIPTION OF THE PREFERRED EMBODIMENT

Figure 1A:
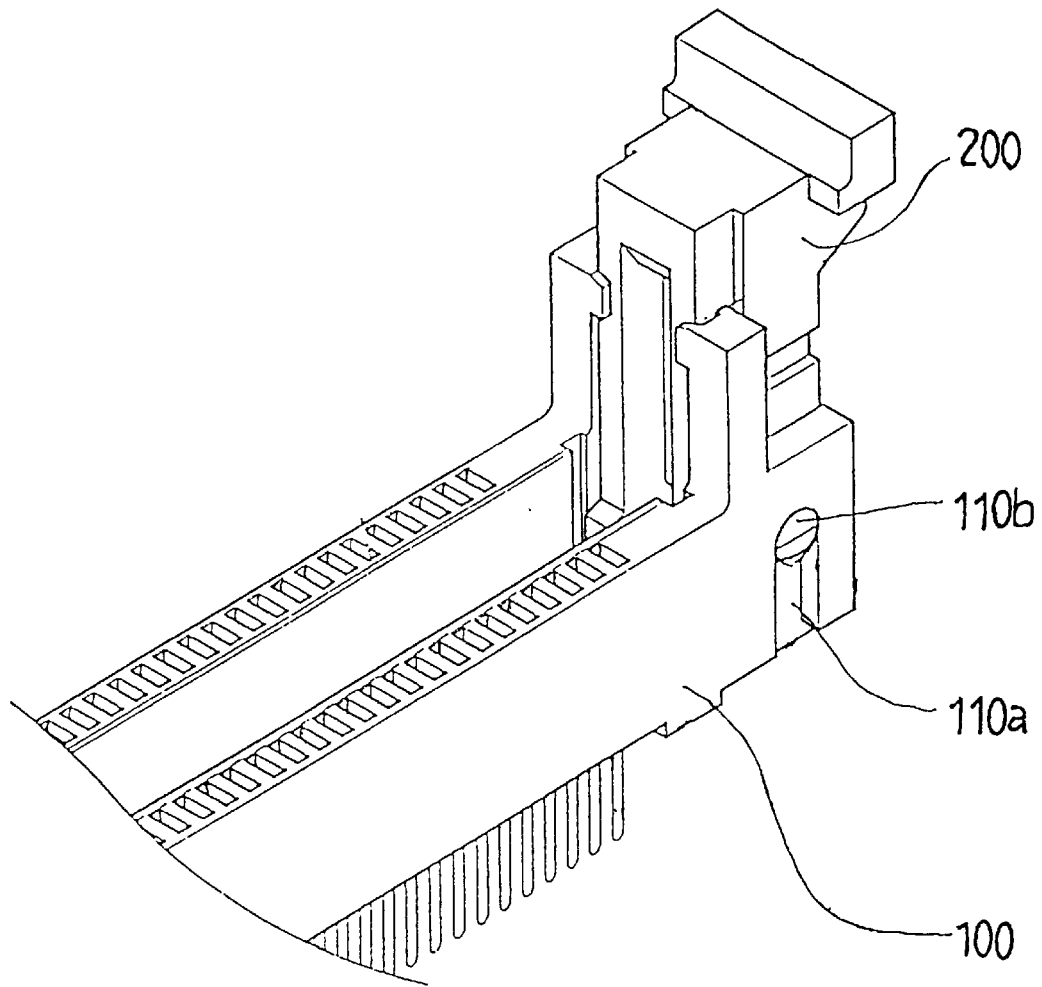
FIGS. 1A and 1B are perspective view of the holding means of a prior art electric connector.
Figure 1B:
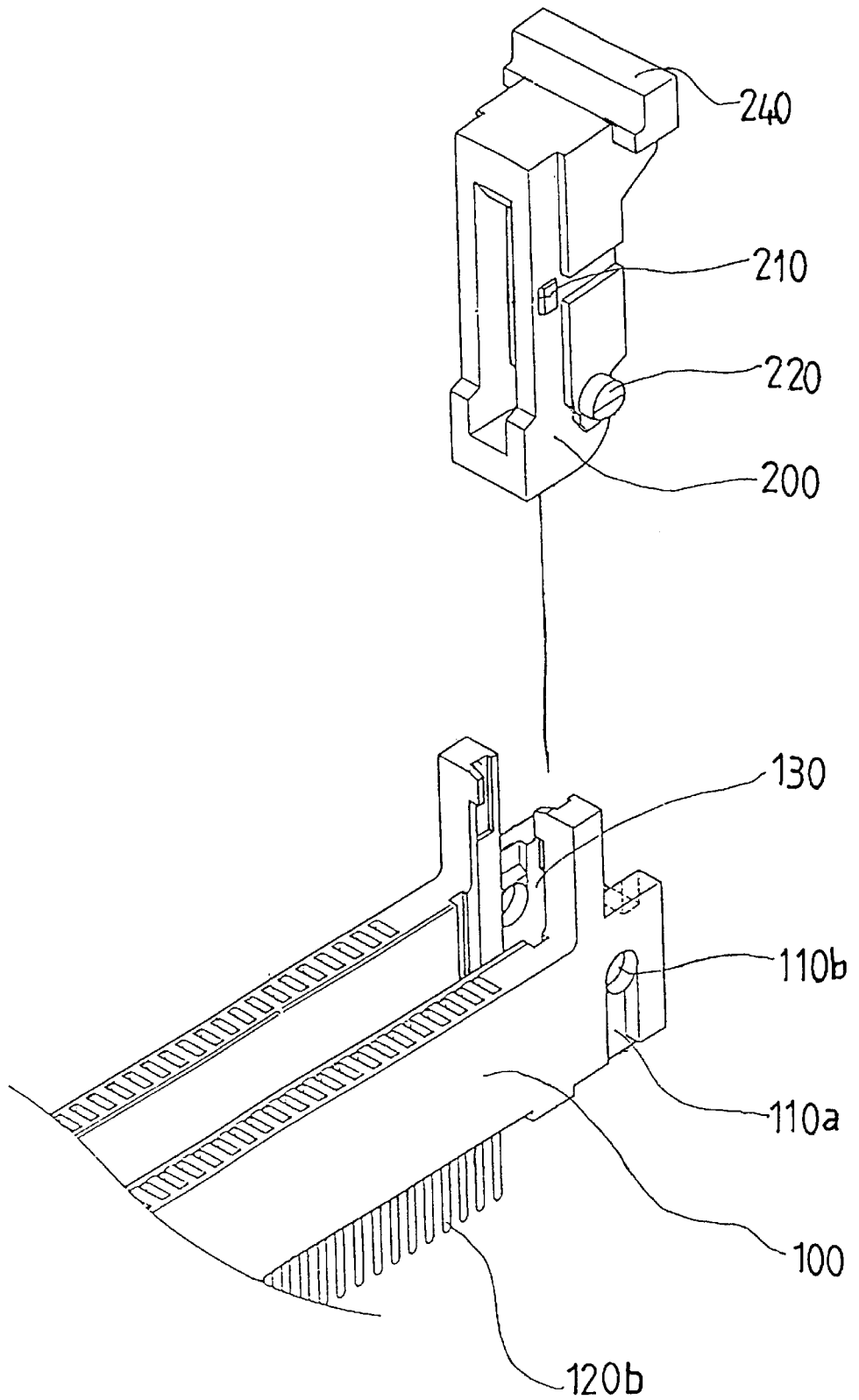
Figure 1C:
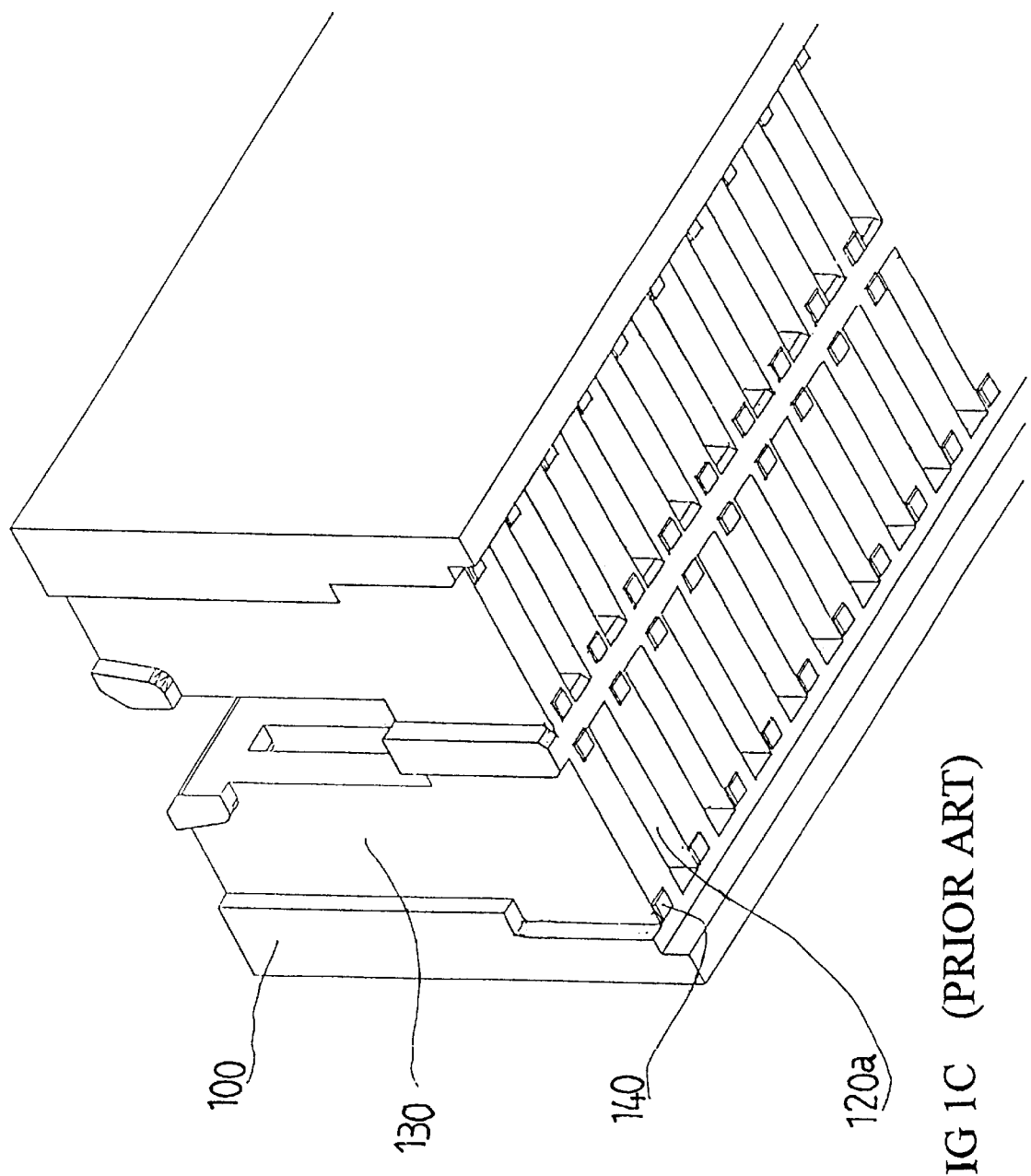
FIG. 1C is a perspective view of the bottom of a prior art terminal seat.
Figure 2:
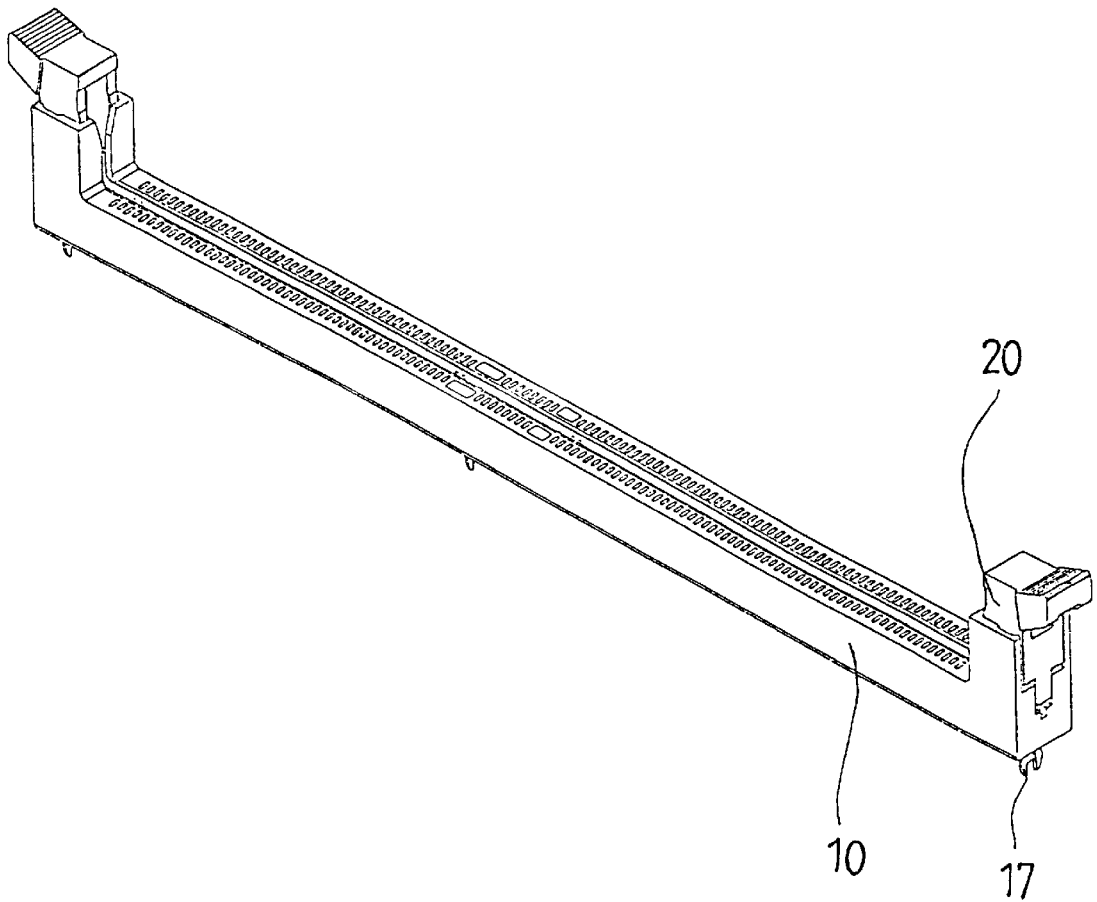
FIG. 2 is a perspective view of the present invention.

FIG. 2 is an assembled perspective view of the present invention. The connection of the embedding piece 20 and the embedding seat 13 in the holder of the electric connector according to the present invention, the relative position of the lower fixing device 17, and the smooth of the outer lateral wall 11 of the terminal seat are illustrated in that figure.

Figure 3A:
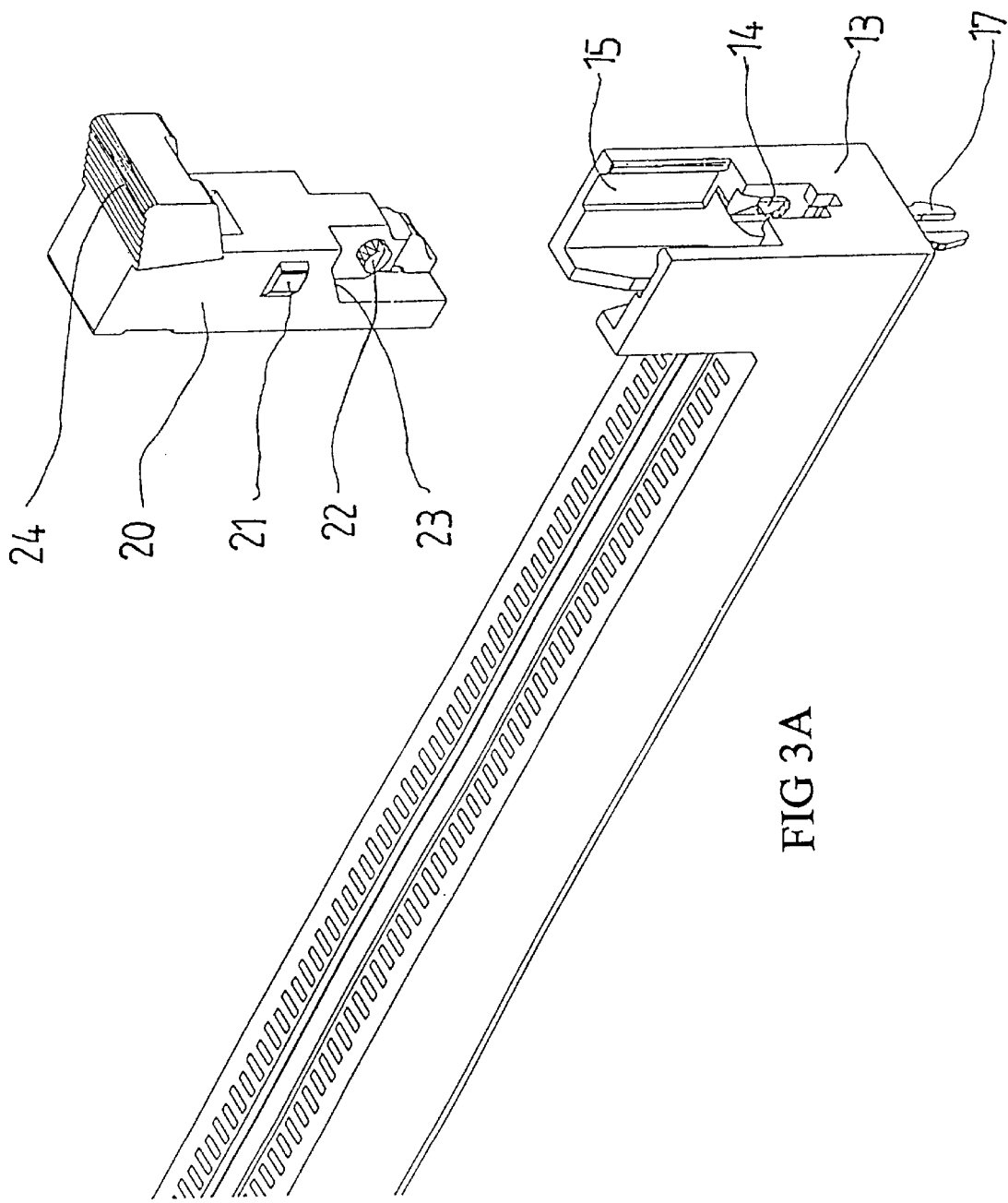
FIGS. 3A and 3B are a partial perspective views of the embedding piece and the embedding seat according to the present invention.
Figure 3B:
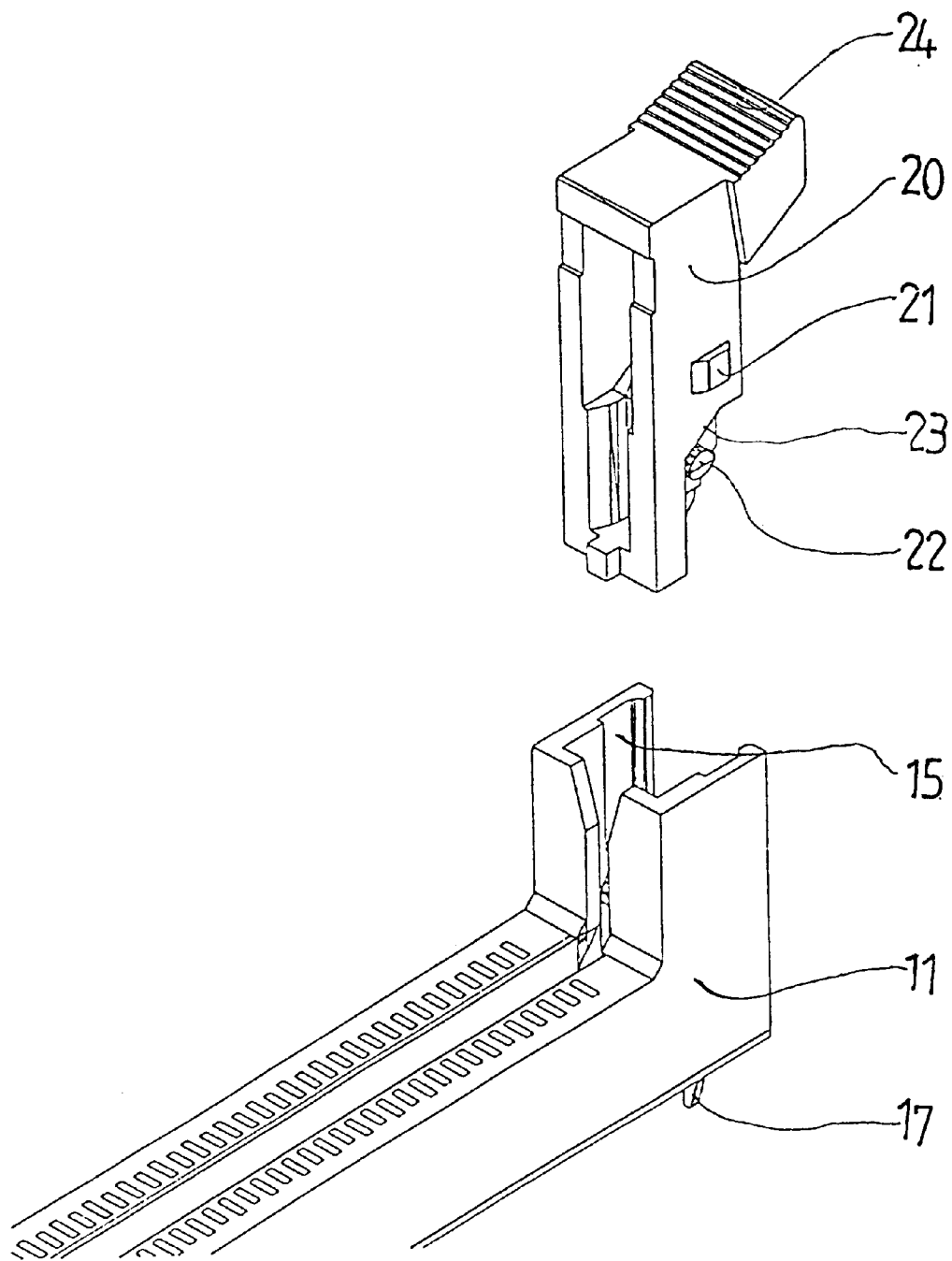

The partial perspective view of the separated embedding seat 13 and the embedding piece 20 are shown in FIGS. 3A and 3B. It is shown that a buckling piece 21 is formed on the outer lateral wall of the embedding piece 20. The embedding piece 20 below the buckling piece 21 is inwards reduced and formed with a pillar 22. An inclined surface 23 is formed above the pillar 22. In order to match the outlook of the embedding piece 20, the embedding seat 13 is formed with a receptacle for receiving the embedding piece 20. The inner side of the embedding seat 13 is formed with a pivotal hole 14 and a guide groove 15. By the angle formed by the buckling piece 21 and the guide groove 15, the embedding piece 20 can be inserted into the embedding seat 13 along a fixed angle and orientation. A pulling portion 24 is formed on the top of the embedding piece 20.

Figure 4:
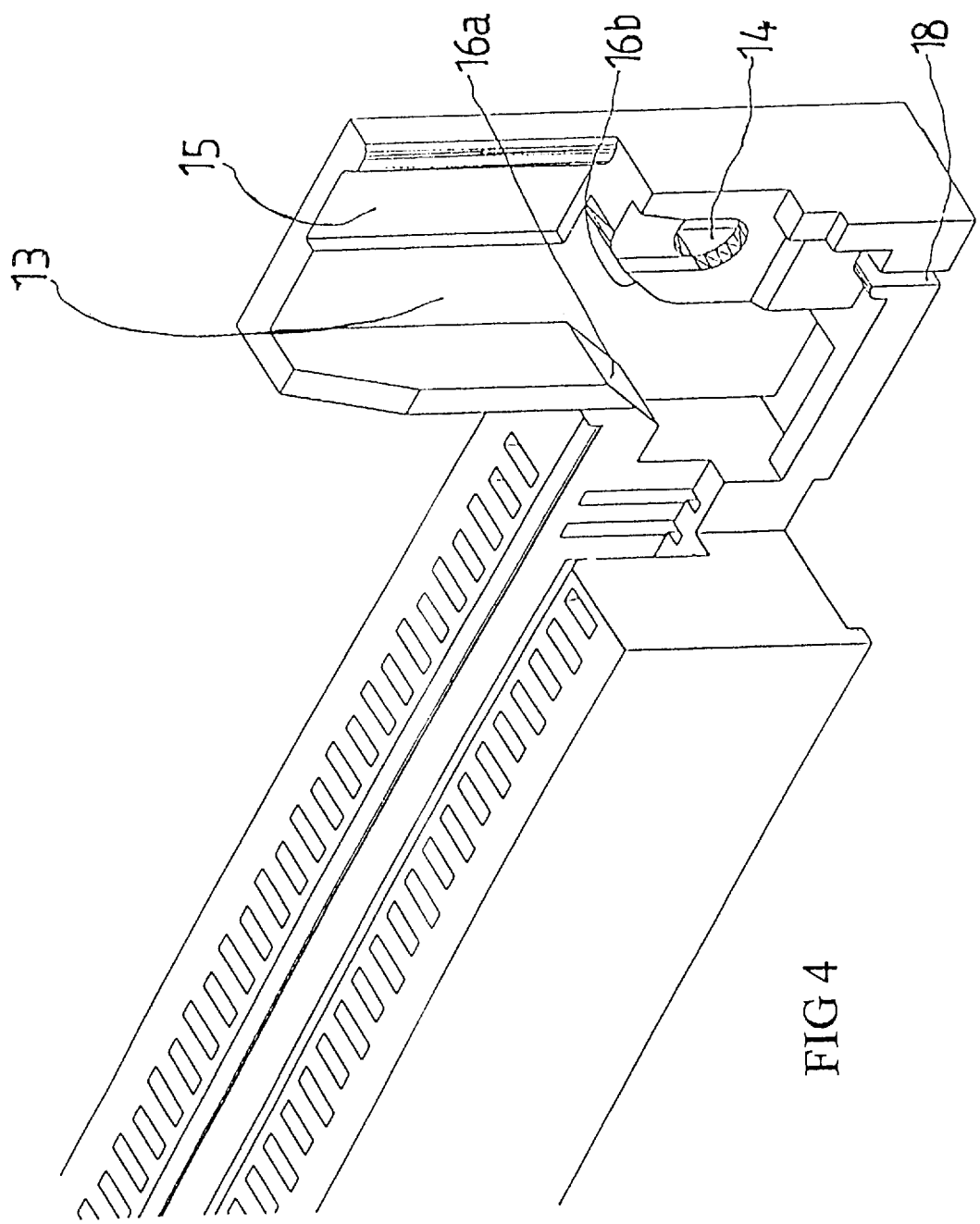
FIG. 4 is a longitudinal cross sectional view of the embedding seat according to the present invention.

A longitudinal cross sectional view of the present invention is shown in FIG. 4. It is shown that in the embedding seat 13, a pair of embedding seat inclined surfaces 16a and 16b for confining the rotary angle of the embedding piece 20 is formed between the guide groove 15 and the pivotal hole 14. The guide groove 15 within the embedding seat 13 for fixing the embedding piece 20 has a fixing depth. The pivotal hole 14 is formed below the guide groove 15. The lower portion thereof has an upward opening and a fixing hole 18 for containing a fixing means.

Figure 5:
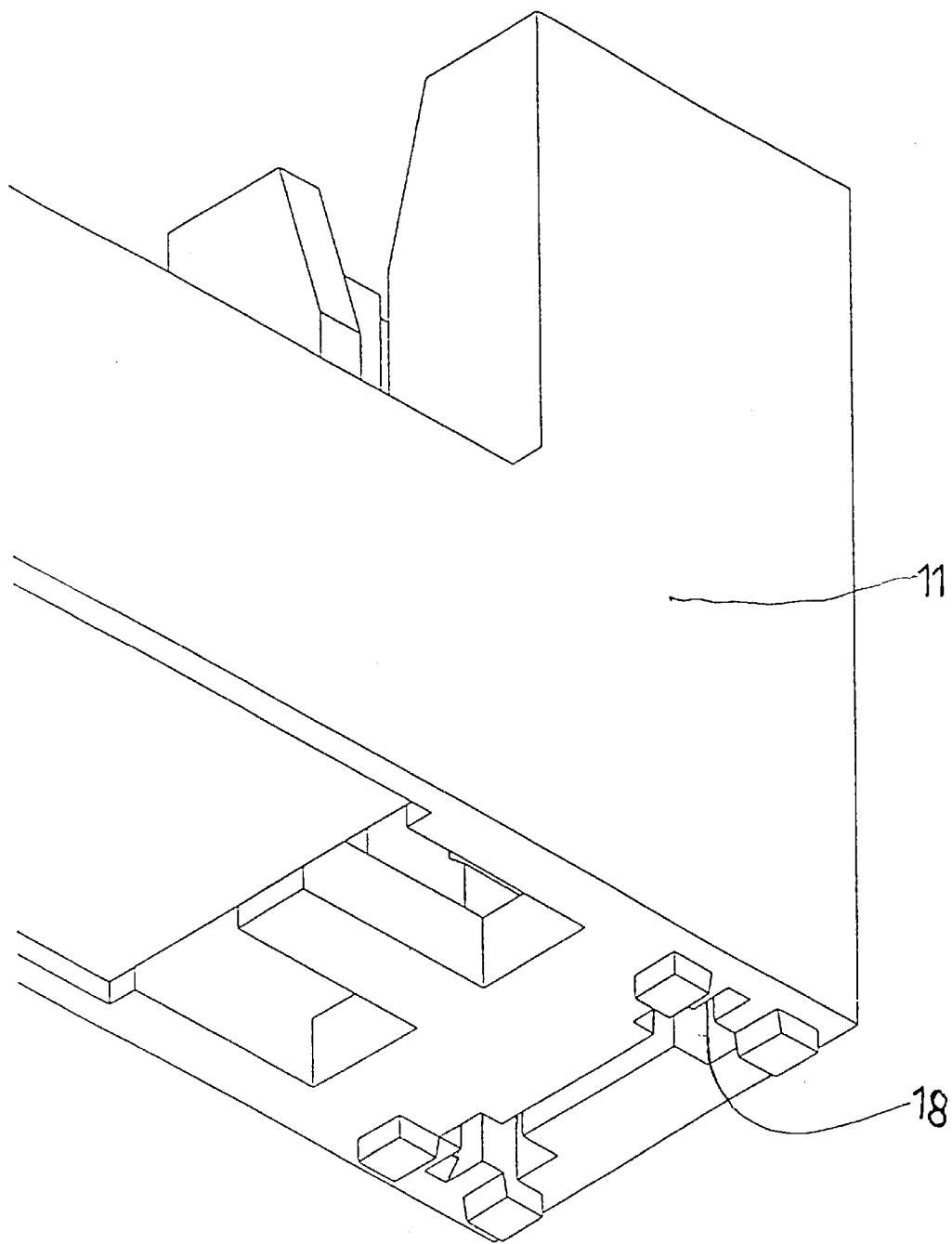
FIG. 5 is a perspective view showing the fixing hole on the bottom of the terminal seat according to the present invention.

FIG. 5 is a perspective view of the fixing hole 18 on the lower surface of terminal seat for containing the fixing means. It is shown that the fixing hole 18 is installed in the proper position on the lower portion of the housing. The fixing means is protruded from the hole 18 so that the body 10 of the terminal seat can be fixed to a mother board. The fixing hole 18 has a fixed distance to the edge of the lower portion of the terminal seat. Thus, the completeness of the side wall surface 11 of the case is retained.

Figure 6A:
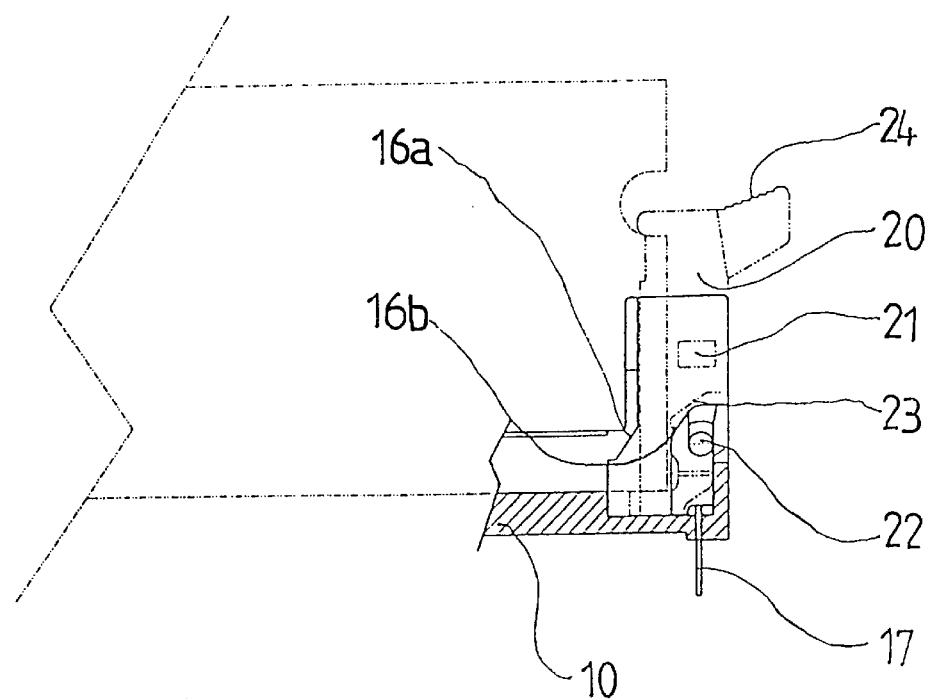
FIGS. 6A and 6B shows an embodiment about the rotation of the embedding piece according to the present invention.
Figure 6B:
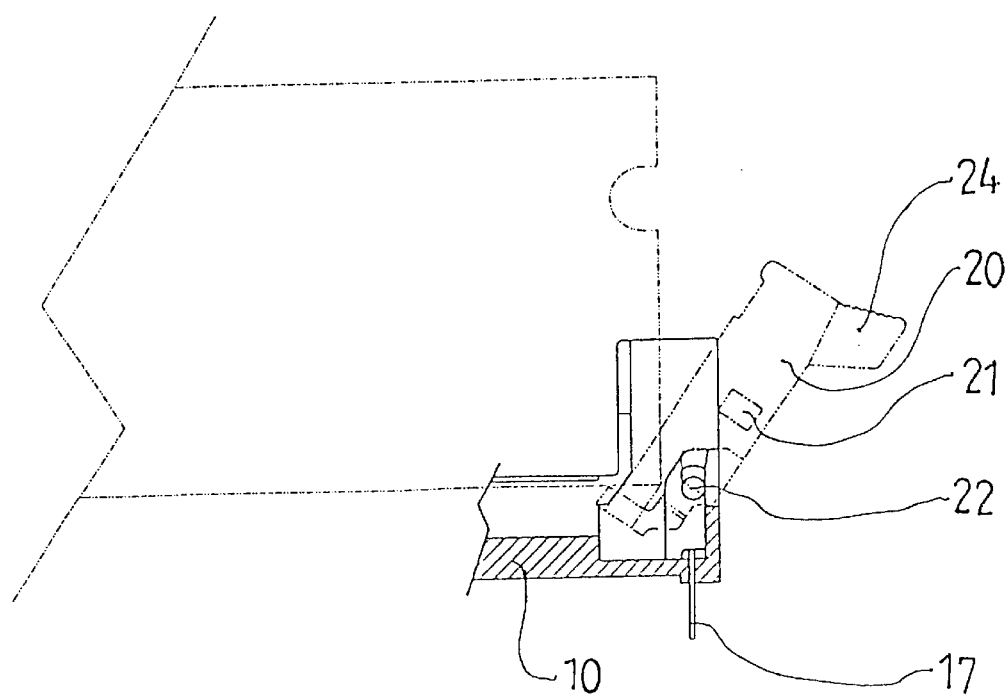

FIGS. 6A and 6B are embodiments showing the rotation of the embedding piece of the present invention. In FIG. 6A, it is shown that the embedding piece 20 stands still in the embedding seat 14. FIG. 6B is a cross sectional view of the embodiment about the rotation of the embedding piece according to the present invention. It is shown that the inner inclined surface 16A and 16B of the embedding seat 14 are rotated with respect to the embedding piece 20. By the inclined surfaces, the embedding piece 20 is rotated within the embedding seat 13 and the rotary angle is confined within a predetermined angle, further the embedding piece 20 and the lateral wall surface of the embedding seat 13 are not destroyed due to a large rotary angle.

Figure 7:
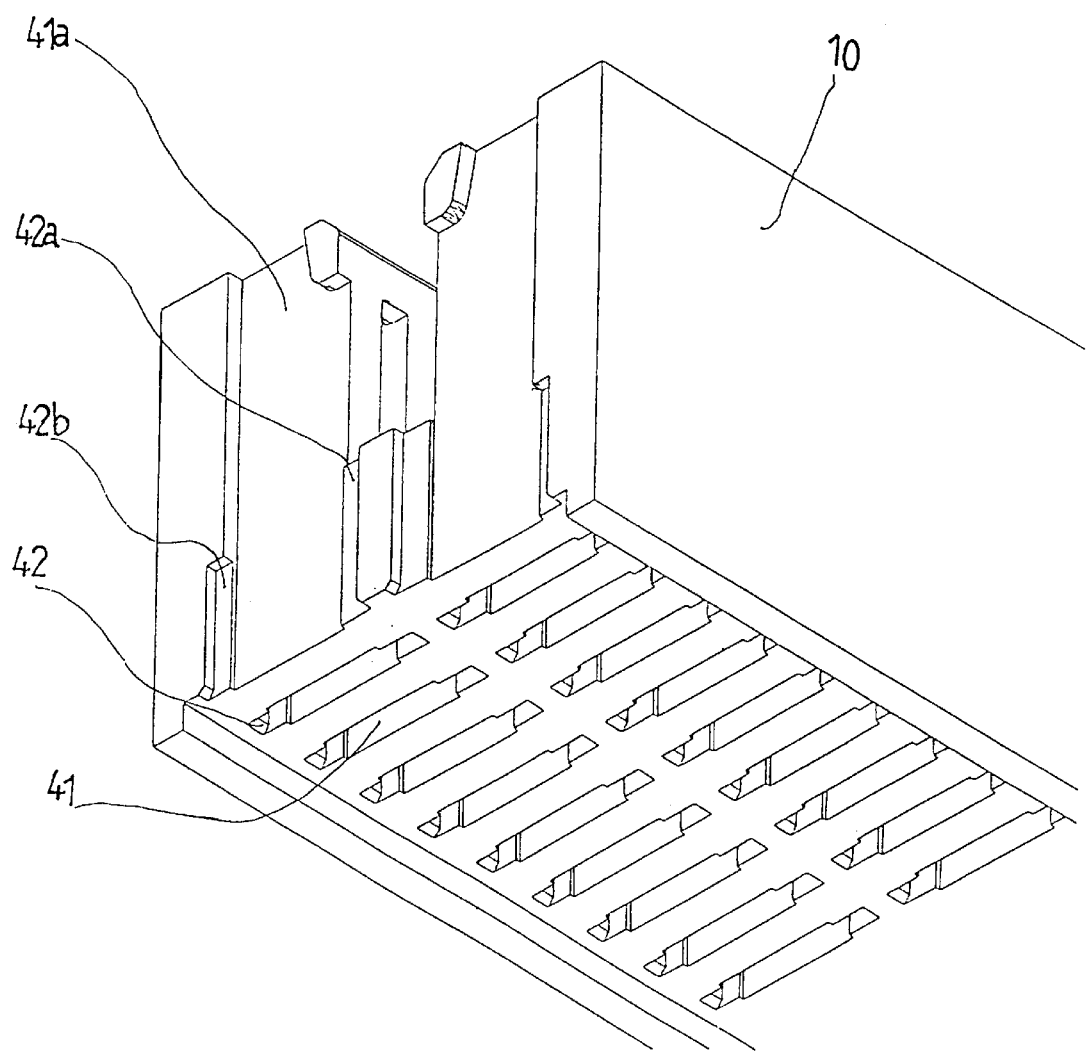
FIG. 7 is a perspective view of the bottom of the terminal seat according to the present invention.

The bottom of the present invention is shown in FIG. 7. The terminal seat 10, a terminal hole 41, the inner wall 41a of the terminal hole, a holding hole 42 and the inner walls 42a and 42b of the holding hole of the electric connector according to the present invention are shown in the figure. The holding hole 42 is extended from the two ends of the terminal hole 41 so to from as a □ shape with the inner wall of the terminal hole. The width of the holding hole is slight larger than the thickness of the terminal body so to form an effective holding to the terminal 50 and to confine the movement of terminal within the terminal hole 43.

Figure 8:
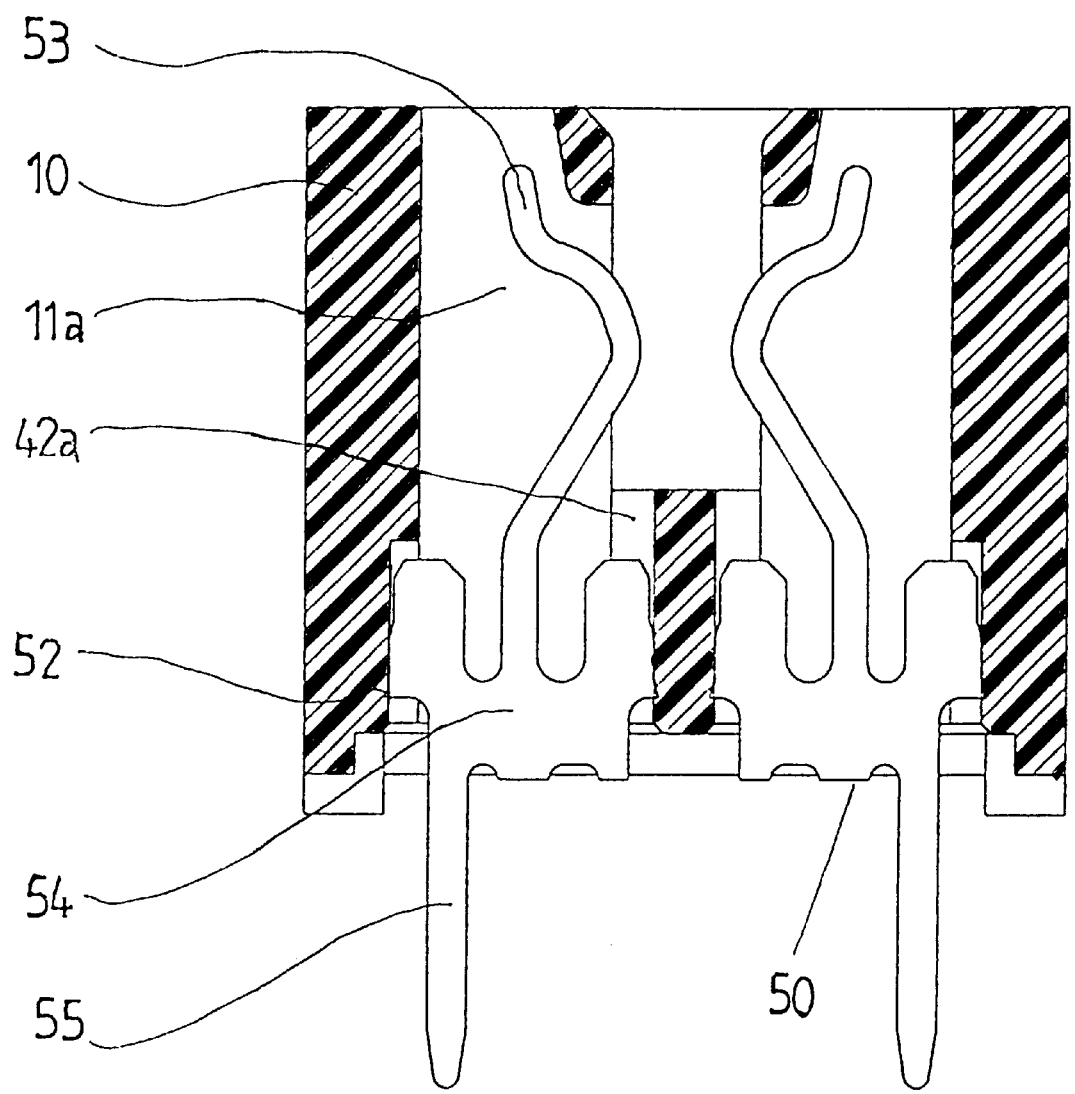
FIG. 8 is a cross sectional view of the bottom of holder according to the present invention.

The cross sectional view of the holding means of the terminal according to the present invention is shown in FIG. 8. The relation of the terminal 50 and the terminal seat 10 in the electric connector of the present invention is illustrated. The section of the terminal inserting into the terminal hole 41 is formed as a curved rod 53 which is bent toward the inner side of the terminal hole 41 and this section does not contact with the inner wall 11a of the terminal. While the center of the terminal is a supporting frame 54, an inverse hook 52 is installed on the outer edge of the supporting frame 54 so to be tightly combined in the inner wall of the holding holes 42a 42b and thus the terminal is firmly held. Pins 55 of the terminal 50 are protruded from terminal seat 10 so to be inserted into a mother board.

Figure 9A:
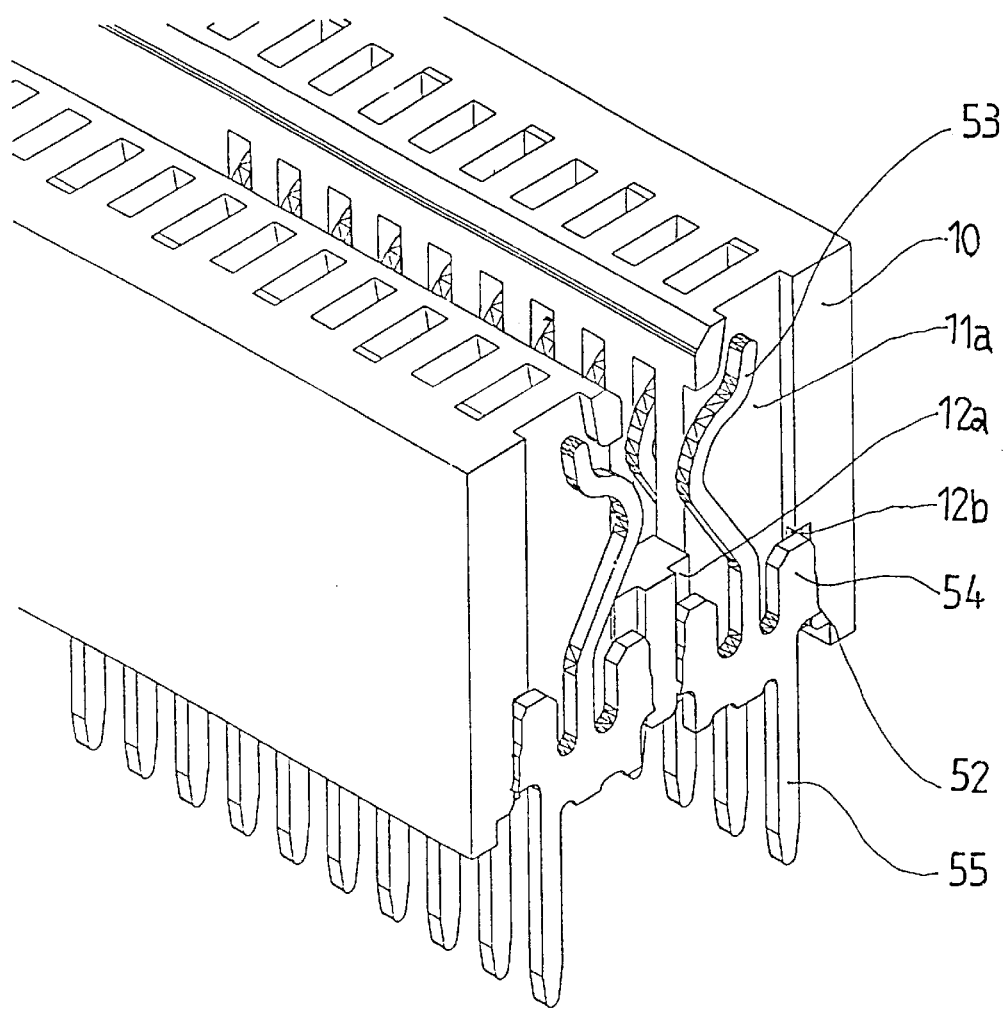
FIGS. 9A and 9B is a cross sectional perspective view of the holding hole according to the present invention.
Figure 9B:
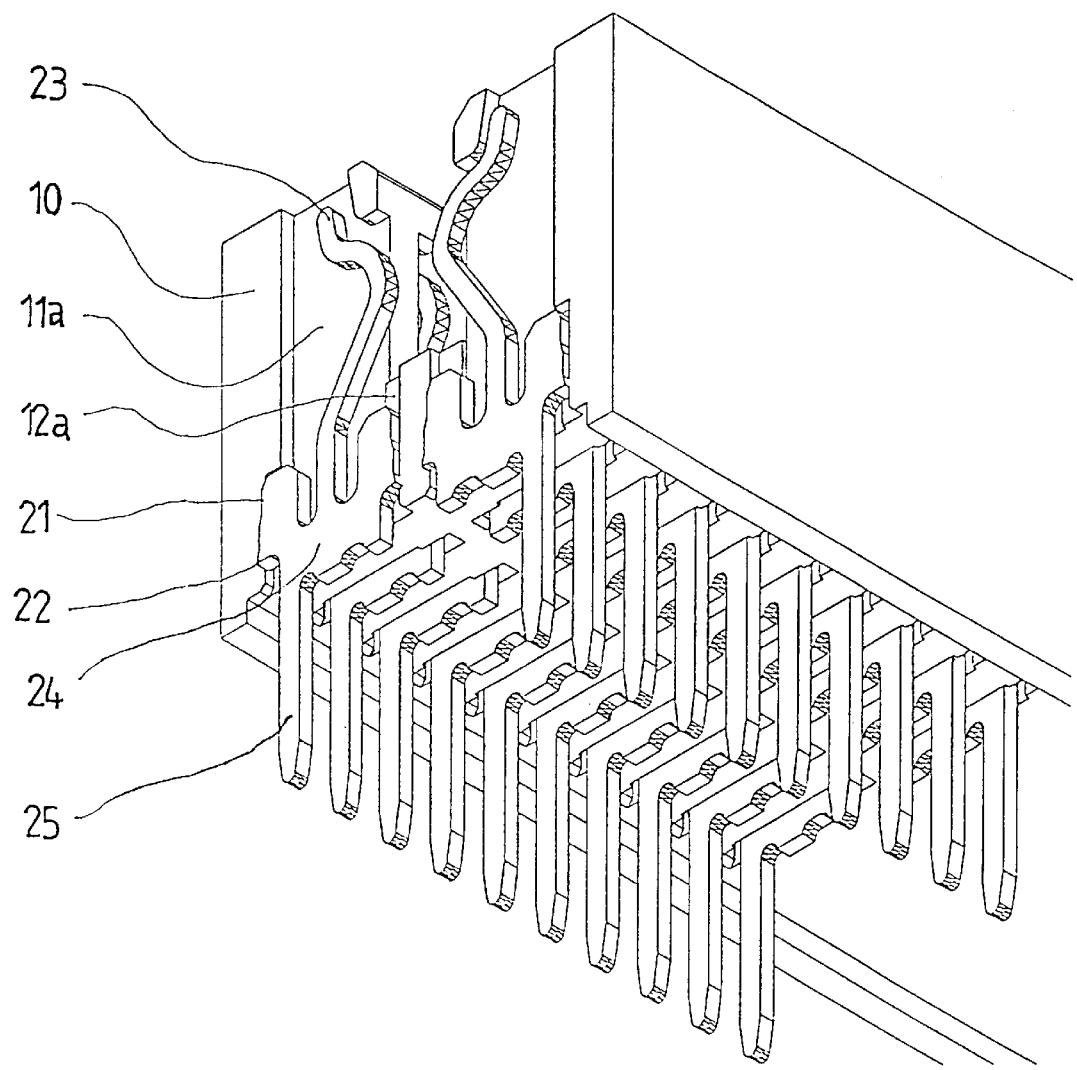

FIGS. 9A and 9B are cross sectional perspective view of the holder according to the present invention. The terminal 50 within a terminal hole 41 is illustrated. A plurality of terminal holes 41 are installed on the bottom of the terminal seat. While two ends thereof are extended with holding holes 42 for holding the terminal, The width of the holding hole 42 is slightly larger than the thickness of the terminal. Therefore, as the terminal 50 is embedded into the terminal hole 41, the holding holes on the two end thereof can effectively hold the terminal by the inner wall 42*a* and 42*b* thereof so that the terminal is held firmly and not be destroyed. Besides, during fabrication, with the finite area on the surface of the terminal seat. The mold shape and manufacturing process are simplified. The electric connection between the terminal and the mother board is effective.

For above description, it is apparent that by the electric connector of the present invention, the angle and orientation of the embedding piece embedding into the embedding seat is fixed and the rotary angle of embedding piece is confined so that the embedding piece and the wall surface of the embedding seat will not be retained. Moreover, the lateral wall surface of the insulating housing is also retained. Moreover, in the electric connector of the present invention, the terminal holder practically has the function of fixing the terminals. Further, the cost, material and time during fabrication is saved. Therefore, the disadvantages in the prior art electric connector is effective improved by the electric connector of the present invention.

Although the invention has been described in detail with reference only to a preferred embodiment, those skilled in the art will appreciate that various modifications can be made without departing from the invention. Accordingly, the invention is defined only by the following claims which are intended to embrace all equivalent thereof.

What is claimed is:

1. An electrical connector comprising:

a) a terminal seat made of electrically insulating material, the terminal seat having opposite ends with an embedding seat on each end, each embedding seat having a hollow interior, a pair of guide grooves extending into the hollow interior from an upper side, a pair of pivot holes opening inwardly into the hollow interior, each pivot hole having a depth insufficient to extend through outer surfaces of the embedding seat, and first and second obliquely inclined surfaces spaced from and facing each other within the hollow interior; and, b) an embedding piece pivotally mounted on each embedding seat, each embedding piece having a first body portion with a first lateral width, a second body portion with a second lateral width less than the first lateral width, a buckling piece extending outwardly from opposite lateral sides of the first body portion so as to engage the pair of guide grooves, a pillar extending outwardly from opposite lateral sides of the second body portion and located so as to engage the pair of pivot holes, third obliquely inclined surfaces on the first body portion located on opposite lateral sides of the second body portion and a pulling portion extending from the first body portion, whereby the embedding piece is pivotally movable with respect to the associated embedding seat between a first position, wherein the first body portion is out of contact with the first and second obliquely inclined surfaces and the third obliquely inclined surface is out of contact with the embedding seat, and a second position in which the first body portion contacts the first and second obliquely inclined surfaces, and the third obliquely inclined surface contacts the embedding seat to limit further pivotal movement of the embedding piece.

2. The electrical connector of claim 1 further comprising:

a) at least one terminal hole in the terminal seat extending through a bottom surface of the terminal seat, the at least one terminal hole having a first portion with an elongated configuration with a first width, and a second, holding portion extending from two opposite ends of the first portion, each holding portion having a second width less than the first width; and, b) a terminal mounted in the at least one terminal hole and having a supporting frame located in the first portion of the at least one terminal hole, a pin extending downwardly from the supporting frame, a curved contact rod extending upwardly from the supporting frame, and hook portions extending from opposite sides of the supporting frame and engaging the holding portion of the at least one terminal hole.

* * * * *